United States Patent
Kim et al.

(10) Patent No.: US 9,620,533 B2
(45) Date of Patent: Apr. 11, 2017

(54) LIQUID CRYSTAL DISPLAY HAVING WHITE PIXELS

(71) Applicant: SAMSUNG DISPLAY CO., LTD., Yongin, Gyeonggi-Do (KR)

(72) Inventors: Hyung June Kim, Anyang-si (KR); Sun Hwa Lee, Yongin-si (KR); Yun Seok Lee, Asan-si (KR); Sang-Uk Lim, Yongin-si (KR)

(73) Assignee: SAMSUNG DISPLAY CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/753,679

(22) Filed: Jun. 29, 2015

(65) Prior Publication Data

US 2016/0197104 A1 Jul. 7, 2016

(30) Foreign Application Priority Data

Jan. 5, 2015 (KR) ........................ 10-2015-0000722

(51) Int. Cl.

| | |
|---|---|
| *H01L 27/32* | (2006.01) |
| *H01L 27/12* | (2006.01) |
| *G02F 1/1368* | (2006.01) |
| *G02F 1/1362* | (2006.01) |

(Continued)

(52) U.S. Cl.
CPC ........ *H01L 27/1251* (2013.01); *G02F 1/1368* (2013.01); *G02F 1/13624* (2013.01); *G02F 1/133514* (2013.01); *H01L 27/124* (2013.01); *H01L 27/3213* (2013.01); *H01L 27/3216* (2013.01); *G02F 1/133707* (2013.01)

(58) Field of Classification Search
CPC ............ H01L 27/3211; H01L 27/3213; H01L 27/3216; H01L 27/3218
See application file for complete search history.

(56) References Cited

U.S. PATENT DOCUMENTS

| | | | |
|---|---|---|---|
| 7,580,097 B2* | 8/2009 | Moon ............... | G02F 1/133555 349/104 |
| 8,416,168 B2* | 4/2013 | Cho ..................... | G09G 3/3607 345/90 |

(Continued)

FOREIGN PATENT DOCUMENTS

| | | |
|---|---|---|
| KR | 1020050066578 | 6/2005 |
| KR | 1020080112855 | 12/2008 |

(Continued)

*Primary Examiner* — Benjamin Sandvik
(74) *Attorney, Agent, or Firm* — F. Chau & Associates, LLC

(57) ABSTRACT

A display device includes red, blue, green, and white pixels, a plurality of gate lines, a plurality of data lines, and a plurality of storage electrodes lines. Each of the red, blue, green, and white pixels includes first to third thin film transistors, a first subpixel electrode connected to an output terminal of the first thin film transistor, and a second subpixel electrode connected to the output terminal of the second thin film transistor. A channel width of a third thin film transistor in each of the red and green pixels is larger than that of a third thin film transistor in each of the blue and white pixels, or a channel length of the third thin film transistor in each of the red and green pixels is longer than that of the third thin film transistor in each of the blue and white pixels.

20 Claims, 14 Drawing Sheets

(51) Int. Cl.
    *G02F 1/1335*     (2006.01)
    *G02F 1/1337*     (2006.01)

(56) References Cited

U.S. PATENT DOCUMENTS

| | | | | |
|---|---|---|---|---|
| 8,587,742 | B2* | 11/2013 | Kimura | H01L 27/3211 |
| | | | | 349/33 |
| 9,368,556 | B2* | 6/2016 | Choi | H01L 27/322 |
| 2006/0221092 | A1* | 10/2006 | Noguchi | G09G 3/3233 |
| | | | | 345/589 |
| 2012/0032583 | A1* | 2/2012 | Kim | H01L 27/322 |
| | | | | 313/504 |
| 2012/0280259 | A1* | 11/2012 | Hatta | H01L 27/3213 |
| | | | | 257/89 |
| 2013/0119857 | A1* | 5/2013 | Su | H05B 33/10 |
| | | | | 313/504 |
| 2014/0098143 | A1 | 4/2014 | Lee et al. | |
| 2016/0033813 | A1* | 2/2016 | Yoon | G02F 1/133514 |
| | | | | 349/108 |
| 2016/0070135 | A1* | 3/2016 | Im | G02F 1/133514 |
| | | | | 349/96 |

FOREIGN PATENT DOCUMENTS

| | | |
|---|---|---|
| KR | 1020100062563 | 6/2010 |
| KR | 1020110045484 | 5/2011 |

* cited by examiner

LIQUID CRYSTAL DISPLAY HAVING WHITE PIXELS

CROSS-REFERENCE TO RELATED APPLICATION

This application claims priority under 35 U.S.C §119 to Korean Patent Application No. 10-2015-0000722, filed on Jan. 5, 2015 in the Korean Intellectual Property Office, the disclosure of which is incorporated by reference herein in its entirety.

TECHNICAL FIELD

This disclosure relates to a liquid crystal display, and more particularly, to a liquid crystal display including white pixels.

DISCUSSION OF THE RELATED ART

A liquid crystal display (LCD) may include gate lines for transmitting a gate signal, data lines for transmitting a data signal, thin film transistors connected to the gate and data lines, and pixels connected to the thin film transistors.

The LCD may be designed and developed to increase visibility and a viewing angle thereof.

SUMMARY

According to an exemplary embodiment of the present invention, a display device is provided. The display device includes a red pixel, a blue pixel, a green pixel, a white pixel, a plurality of gate lines, a plurality of data lines, and a plurality of storage electrodes lines. Each of the red, blue, green, and white pixels includes first and second thin film transistors, a third thin film transistor, a first subpixel electrode, and a second subpixel electrode. Each of the first and second thin film transistors includes control terminals connected to a first gate line of the plurality of gate lines and input terminals connected to a first data line of the plurality of data lines. The third thin film transistor includes a control terminal connected to the first gate line, an input terminal connected to an output terminal of the second thin film transistor, and an output terminal connected to a first storage electrode of the plurality of storage electrode lines. The first subpixel electrode is connected to an output terminal of the first thin film transistor. The second subpixel electrode is connected to the output terminal of the second thin film transistor. A channel width of the third thin film transistor included in each of the red and green pixels is larger than a channel width of the third thin film transistor included in each of the blue and white pixels, or a channel length of the third thin film transistor included in each of the red and green pixels is longer than a channel length of the third thin film transistor included in each of the blue and white pixels.

Sizes of the blue and white pixels may be larger than a size of each of the red and green pixels.

According to an exemplary embodiment of the present invention, a display device is provided. The display device includes a red pixel, a blue pixel, a green pixel, and a white pixel, a plurality of gate lines, a plurality of data lines, and a plurality of storage electrode lines. Each of the red, blue, green, and white pixels includes first and second thin film transistors, a third thin film transistor, a first subpixel electrode, and a second subpixel electrode. Each of the first and second thin film transistors includes control terminals connected to a first gate line of the plurality of gate lines and input terminals connected to a first data line of the plurality of data lines. The third thin film transistor includes a control terminal connected to the first gate line, an input terminal connected to an output terminal of the second thin film transistor, and an output terminal connected to a first storage electrode line of the plurality of storage electrode lines. The first subpixel electrode is connected to an output terminal of the first thin film transistor. The second subpixel electrode is connected to the output terminal of the second thin film transistor. Voltages applied to the first storage electrode lines connected to the blue and white pixels are higher than voltages applied to the first storage electrode lines connected to the red and green pixels.

Sizes of the blue and white pixels may be larger than a size of each of the red and green pixels.

According to an exemplary embodiment of the present invention, a display device is provided. The display device includes a red pixel, a blue pixel, a green pixel, a white pixel, a plurality of gate lines, a plurality of data lines, and a plurality of storage electrode lines. Each of the red pixel and the green pixel includes first and second thin film transistors, a third thin film transistor, a first subpixel electrode, and a second subpixel electrode. Each of the first and second thin film transistors includes control terminals connected to a first gate line of the plurality of gate lines and input terminals connected to a first data line of the plurality of data lines. The third thin film transistor includes a control terminal connected to the first gate line, an input terminal connected to an output terminal of the second thin film transistor, and an output terminal connected to a first storage electrode line of the plurality of storage electrode lines. The first subpixel electrode is connected to an output terminal of the first thin film transistor. The second subpixel electrode is connected to the output terminal of the second thin film transistor. Each of the blue pixel and the white pixel includes a fourth thin film transistor, a fifth thin film transistor, a third subpixel electrode, and a fourth subpixel electrode. The fourth thin film transistor includes a control terminal connected to a second gate line of the plurality of gate lines and an input terminal connected to a second data line of the plurality of data lines. The fifth thin film transistor includes a control terminal connected to the second gate line and an input terminal connected to a third data line of the plurality of data lines. The third subpixel electrode is connected to an output terminal of the fourth thin film transistor. The fourth subpixel electrode is connected to an output terminal of the fifth thin film transistor.

Sizes of the blue and white pixels may be larger than a size of each of the red and green pixels.

Each of the first subpixel electrode, the second subpixel electrode, the third subpixel electrode, and the fourth subpixel electrode may include a stem portion and minute branch portions extending from the stem portion. The first subpixel electrode of the red pixel or the green pixel may be different from the third subpixel electrode of the white pixel in at least one of a width of the stem portion, a tilt angle of the stem portion, a width of the minute branch portions, an interval between the minute branch portions, and a tilt angle of the minute branch portions.

According to an exemplary embodiment of the present invention, a display device is provided. The display device includes a red pixel, a blue pixel, a green pixel, a white pixel, a plurality of gate lines, a plurality of data lines, and a plurality of storage electrode lines. Each of the red, blue, green, and white pixels includes first and second thin film transistors, a third thin film transistor, a first subpixel electrode, and a second subpixel electrode. Each of the first and second thin film transistors includes control terminals connected to a first gate line of the plurality of gate lines and input terminals connected to a first data line of the plurality of data lines. The third thin film transistor includes a control terminal connected to the first gate line, an input terminal connected to an output terminal of the second thin film transistor, and an output terminal connected to a first storage electrode line of the plurality of storage electrode lines. The first subpixel electrode is connected to an output terminal of the first thin film transistor. The second subpixel electrode is connected to the output terminal of the second thin film transistor. A size of the first subpixel electrode included in the white pixel is smaller than a size of each of the first subpixel electrodes included in the red, green, and blue pixels.

A size of the second subpixel electrode included in the white pixel may be larger than a size of each of the second subpixel electrodes included in the red, green, and blue pixels.

The first to third thin film transistors of the white pixel may be disposed above the first gate line.

According to an exemplary embodiment of the present invention, a display device is provided. The display device includes a red pixel, a blue pixel, a green pixel, and a white pixel, a plurality of gate lines, and a plurality of data lines. When a size of the white pixel is larger than a size of each of the red, blue, and green pixels, a cell gap of the white pixel is smaller than a cell gap of each of the red, blue, and green pixels. When the size of the white pixel is smaller than the size of each of the red, blue, and green pixels, the cell gap of the white pixel is larger than the cell gap of each of the red, blue, and green pixels.

When the size of the white pixel is larger than the size of each of the red, blue, and green pixels, the cell gap of the white pixel may correspond to substantially 50% to 90% of the cell gap of each of the red, blue, and green pixels, When the size of the white pixel is smaller than the cell gap of each of the red, blue, and green pixels, the cell gap of the white pixel may correspond to substantially 105% to 150% of the cell gap of each of the red, blue, and green pixels.

According to an exemplary embodiment of the present invention, a display device is provided. The display device includes a white pixel. The white pixel includes a blue dye.

According to an exemplary embodiment of the present invention, a display device is provided. The display device includes first and second red pixels, a blue pixel, first and second green pixels, and a white pixel which are arranged in a first direction. Each of the first and second red pixels includes first and second subpixel electrodes. Each of the first and second green pixels includes third and fourth subpixel electrodes. The blue pixel includes a first pixel electrode. The white pixel includes a second pixel electrode. A size of the first pixel electrode corresponds to a size of the first subpixel electrode, and a size of the second pixel electrode corresponds to a size of the second subpixel electrode.

The blue pixel and the white pixel may be disposed between the first red pixel and the first green pixel, or between the first and second red pixels, or between the first and second green pixels.

A first voltage may be applied to the first subpixel electrode, and a second voltage lower than the first voltage may be applied to the second subpixel electrode.

According to an exemplary embodiment of the present invention, a display device is provided. The display device includes a red pixel, a blue pixel, a green pixel, a white pixel, a plurality of gate lines, a plurality of data lines, and a plurality of storage electrode lines. The white pixel includes first and second subpixel electrodes connected to a first gate line of the plurality of gate lines and a first data line of the plurality of data lines. Different voltages are applied to the first and second subpixel electrodes of the white pixel. Each of the red, blue, and green pixels includes third and fourth subpixel electrodes connected to a second data line of the plurality of data lines and the first gate line. Substantially the same voltage is applied to the third and fourth subpixel electrodes of each of the red, blue, and green pixels.

The white pixel may include first to third thin film transistors each of which includes control terminals connected to the first gate line and input terminals connected to the first data line. The third thin film transistor includes a control terminal connected to the first gate line, an input terminal connected to an output terminal of the second thin film transistor, and an output terminal connected to a first storage electrode line of the plurality of storage electrode lines. The first subpixel electrode of the white pixel may be connected to an output terminal of the first thin film transistor. The second subpixel electrode of the white pixel may be connected to the output terminal of the second thin film transistor.

Each of the red, blue, and green pixels may include a fourth thin film transistor. The fourth thin film transistor may include a control terminal connected to the first gate line and an input terminal connected to the second data line. The third and fourth subpixel electrodes of each of the red, blue, and green pixels may be connected to an output terminal of the fourth thin film transistor.

The third and fourth subpixel electrodes of each of the red, blue, and green pixels may be connected to each other.

BRIEF DESCRIPTION OF THE DRAWINGS

A more complete appreciation of the present invention and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
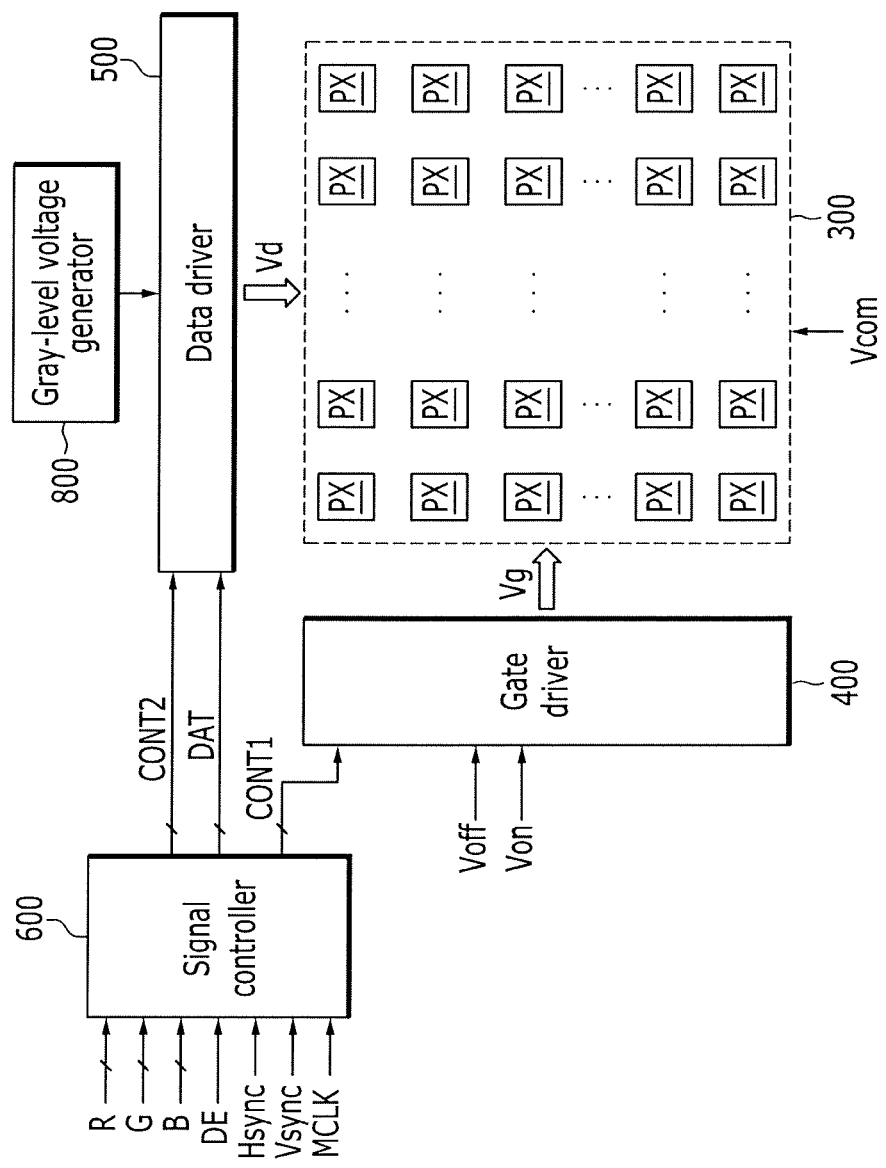
FIG. 1 is a block diagram of a liquid crystal display (LCD) according to an exemplary embodiment of the present invention.

Exemplary embodiments of the present invention will be described more fully hereinafter with reference to the accompanying drawings, in which exemplary embodiments of the invention are shown.

The present invention may be modified in various different forms without departing from the spirit or scope of the present invention and should not be construed as being limited to the exemplary embodiments set forth herein.

In the drawings, thickness of layers, films, panels, regions, etc. may be exaggerated for clarity.

Like reference numerals may designate like elements throughout the specification.

In a vertical alignment (VA) mode liquid crystal display (LCD) including white pixels, the white pixels increase a yellowish phenomenon at sides of the LCD (hereinafter, referred to as "a side yellowish phenomenon) when a driving voltage increases to cause liquid crystals to have high refractive anisotropy ($\Delta n$).

For example, when luminance of the white pixels increases, the side yellowish phenomenon increases.

Since a cell gap of the white pixels is set to be appropriate for a green wavelength range in the VA mode, a blue light component having a relatively short wavelength may be further reduced at side, considering that a transmission path of light through the liquid crystals is longer at side than at front.

In an exemplary embodiment of the present invention, to reduce the side yellowish phenomenon, blue pixels and the white pixels of the LCD are operated with a lower voltage than the red and green pixels.

For the blue and white pixels to be operated with the lower voltage than the red and green pixels, channel widths and channel lengths of thin-film transistors (TFTs), voltages applied to storage electrode lines, and voltages applied to two subpixel electrodes may be varied according to various methods.

Hereinafter, a method of varying channel widths and lengths of the TFTs or voltages of the storage electrode lines will be described.

Figure 2:
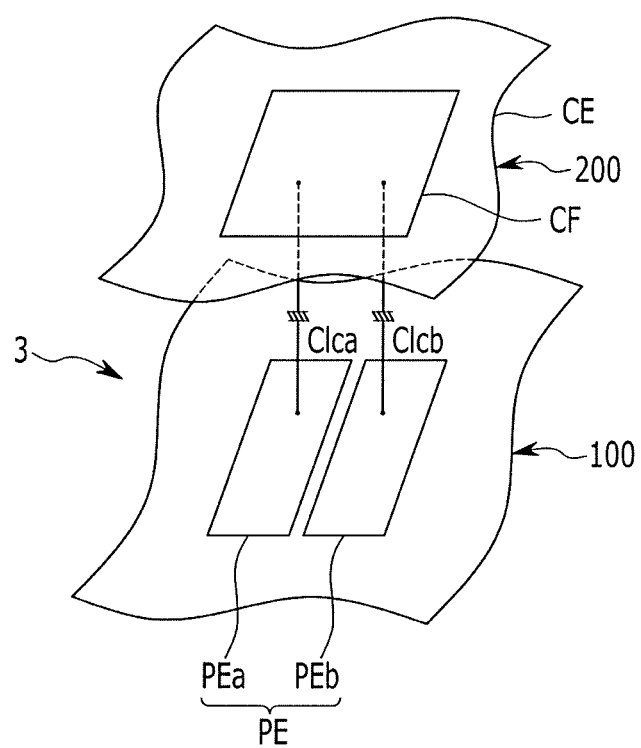
FIG. 2 is a circuit diagram illustrating a pixel and a structure of the LCD according to an exemplary embodiment of the present invention.

FIG. 1 is a block diagram of a liquid crystal display (LCD) according to an exemplary embodiment of the present invention, FIG. 2 is a circuit diagram illustrating a pixel and a structure of the LCD according to an exemplary embodiment of the present invention.

As shown in FIG. 1, the LCD according to an exemplary embodiment of the present invention includes a liquid crystal panel assembly 300, gate and data drivers 400 and 500 connected to the liquid crystal panel assembly 300, a gray-level voltage generator 800 connected to the data driver 500, and a signal controller 600 that controls the liquid crystal panel assembly 300, the gate and data drivers 400 and 500, and/or the gray-level voltage generator 800.

The liquid crystal panel assembly 300 may include a plurality of signal lines and a plurality of pixels PX that are connected to the plurality of signal lines and arranged substantially in a matrix form.

Referring to FIG. 2, the liquid crystal panel assembly 300 includes a thin film transistor array panel 100, a display panel 200 opposite to the thin film transistor array panel 100, and a liquid crystal layer 3 interposed therebetween.

The signal lines include a plurality of gate lines for transmitting a gate signal (e.g., a scanning signal) and a plurality of data lines for transmitting a data signal.

The gate lines extend in a row direction to be substantially parallel to each other, and the data lines extend in a column direction to be substantially parallel to each other.

Each pixel PX includes a pair of subpixels, and each subpixel includes liquid crystal capacitors Clca and Clcb.

At least one of the two subpixels (e.g., the pair of subpixels) includes a switching element that is connected to the gate line, the data line, and the liquid crystal capacitors Clca and Clcb.

The liquid crystal capacitor Clca includes two terminals which correspond to a subpixel electrode PEa of the thin film transistor array panel 100 and a common electrode CE of the display panel 200, the liquid crystal capacitor Clcb includes two terminals which correspond to a subpixel electrode PEb of the thin film transistor array panel 100 and the common electrode CE of the display panel 200. In addition, the liquid crystal layer 3 between the subpixel electrodes PEa and PEb and the common electrode CE serves as a dielectric material therebetween.

The subpixel electrodes PEa and PEb are separated from each other and form a single pixel electrode PE.

The common electrode CE is formed on an entire surface of the display panel 200, and is applied with a common voltage Vcom.

The liquid crystal layer 3 has negative dielectric anisotropy, and liquid crystal molecules of the liquid crystal layer 3 may be disposed to be substantially perpendicular to the thin film transistor array panel 100 when no electric field is present in the liquid crystal layer 3.

Each pixel PX may display a primary color (e.g., a spatial division approach) or alternately the primary color may be display over time (e.g., a temporal division approach) to realize color display, and thus, a spatial or temporal summation of these primary colors may be recognized as a desired color although other sets of primary colors may be used.

For example, the primary colors may include red, green, and blue colors.

FIG. 2 illustrates an example of the spatial division in which each pixel PX includes a color filter CF for displaying one of the primary colors in an area of the display panel 200.

Unlike what is shown in FIG. 2, the color filter CF may be formed above or below the subpixel electrodes PEa and PEb of the thin film transistor array panel 100.

At least one polarizer for polarizing light is attached to an outer surface of the liquid crystal panel assembly 300.

Referring back to FIG. 1, the gray-level voltage generator 800 generates gray-level voltages associated with transmittance of the pixel PX or a limited number of gray-level voltages (hereinafter referred to as "reference gray-level voltages").

The reference gray-level voltages may include voltages of positive and negative polarities with respect to the common voltage Vcom.

The gate driver 400 is connected to the gate lines of the liquid crystal panel assembly 300 such that the gate signal Vg including gate-on and gate-off voltages Von and Voff is applied to the gate lines.

The data driver 500 is connected to the data lines of the liquid crystal panel assembly 300, and selects the gray-level voltages output from the gray-level voltage generator 800 such that they are applied as the data signals to the data lines.

For example, if the gray-level voltage generator 800 does not provide all the gray-level voltages and provide only a predetermined number of reference gray-level voltages, the data driver 500 may generate all the gray-level voltages by dividing the reference gray-level voltages and then selecting the data signal among them.

The signal controller 600 includes an image signal conversion unit 610, and controls the gate driver 400, the data driver 500, etc.

The driving devices 400, 500, 600, and 800 may be directly mounted on the liquid crystal panel assembly 300 as at least one integrated circuit (IC) chip, may be mounted on a flexible printed circuit film to be attached to the liquid crystal panel assembly 300 as a tape carrier package (TCP), or may be mounted on an additional printed circuit board (PCB).

In an exemplary embodiment of the present invention, the driving devices 400, 500, 600, and 800, the signal lines, the thin film transistor switching elements, etc., may be integrated into the liquid crystal panel assembly 300.

In addition, the driving devices 400, 500, 600, and 800 may be integrated into a single chip. In this case, at least one of the driving devices 400, 500, 600, and 800 or at least one circuit element forming the driving devices 400, 500, 600, and 800 may be disposed outside of the single chip.

Next, the LCD according to an exemplary embodiment of the present invention will be further described with reference to FIGS. 3 to 8 as well as FIGS. 1 and 2.

Figure 3:
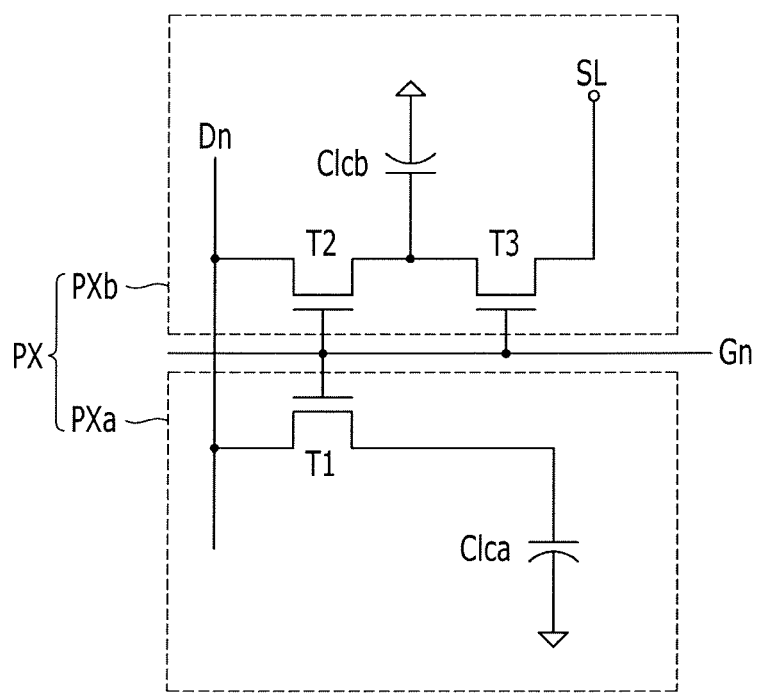
FIG. 3 is a circuit diagram of a pixel of the LCD according to an exemplary embodiment of the present invention.
Figure 4:
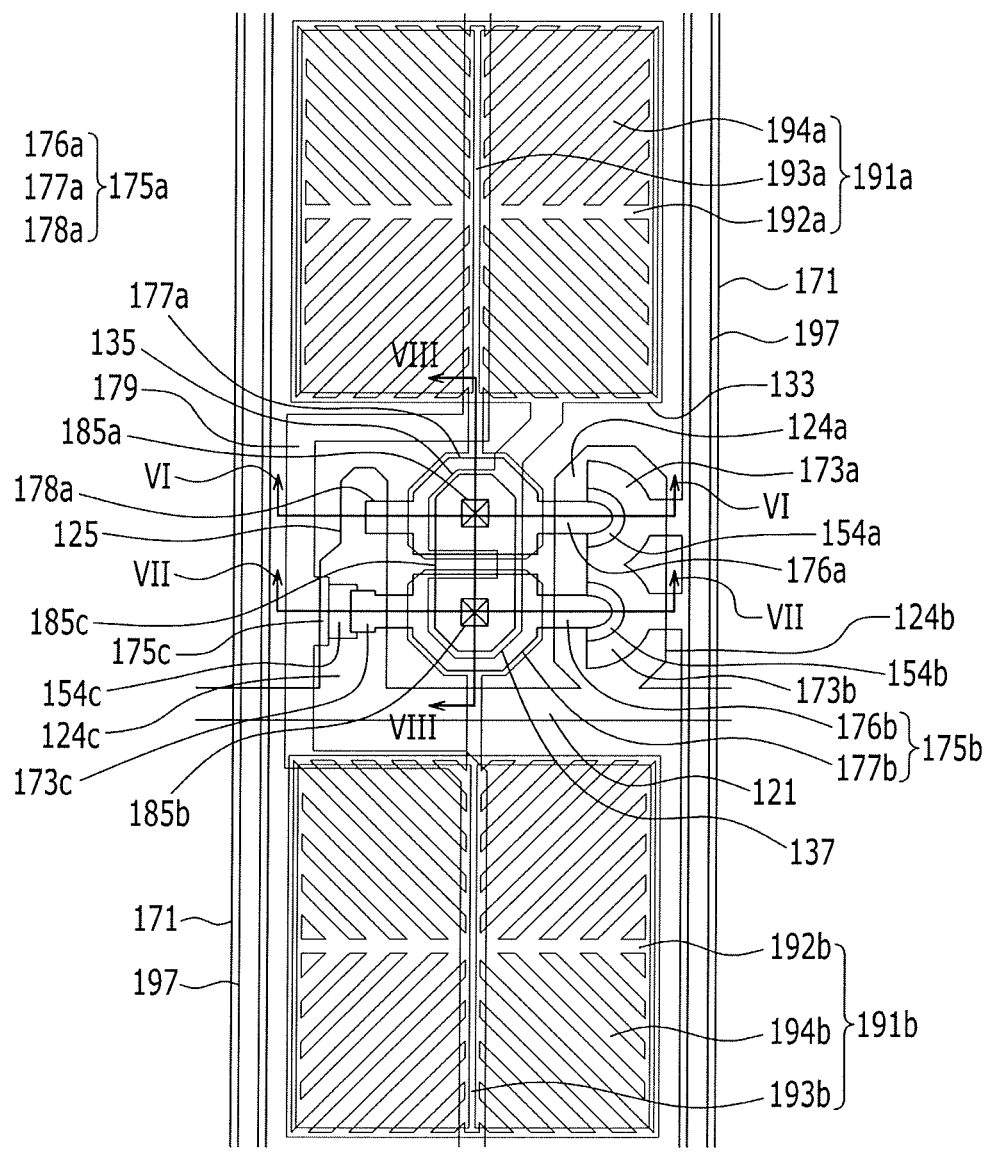
FIG. 4 is a plan view of the LCD according to an exemplary embodiment of the present invention.
Figure 5:
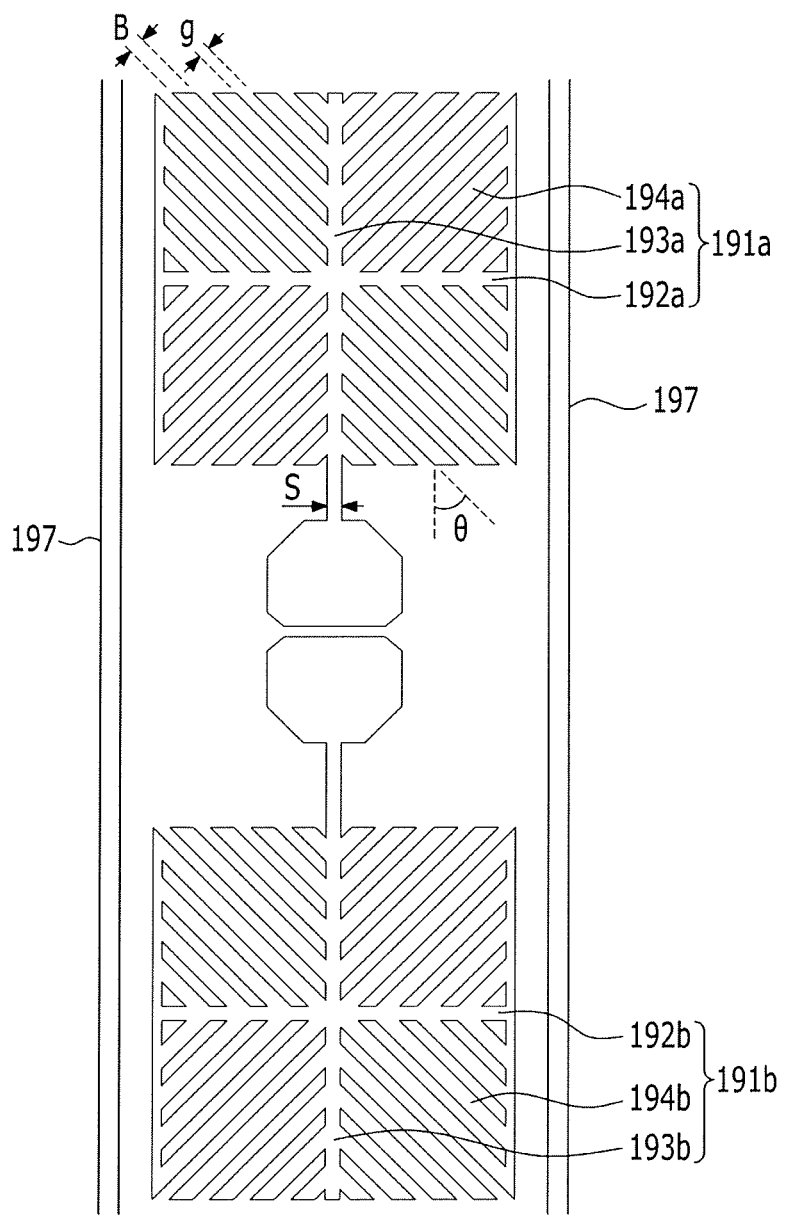
FIG. 5 is a plan view of some layers of the LCD according to an exemplary embodiment of the present invention.

FIG. 3 is a circuit diagram of a pixel of the LCD according to an exemplary embodiment of the present invention, FIG. 4 is a plan view of the LCD according to an exemplary embodiment of the present invention, and FIG. 5 is a plan view of some layers of the LCD according to an exemplary embodiment of the present invention.

FIG. 5 illustrates a layer where a first subpixel electrode, a second subpixel electrode, and a shielding electrode are formed.

Figure 6:
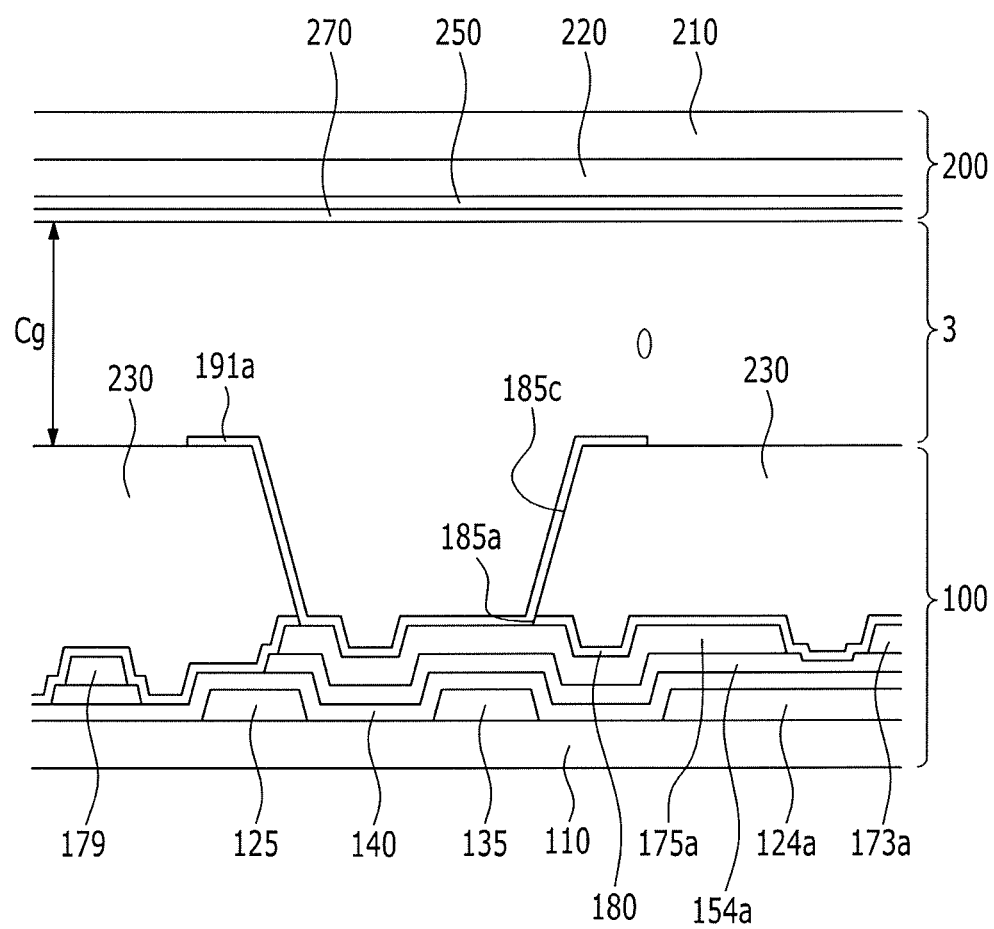
FIG. 6 is a cross-sectional view of the LCD according to an exemplary embodiment of the present invention, taken along a line VI-VI of FIG. 4.
Figure 7:
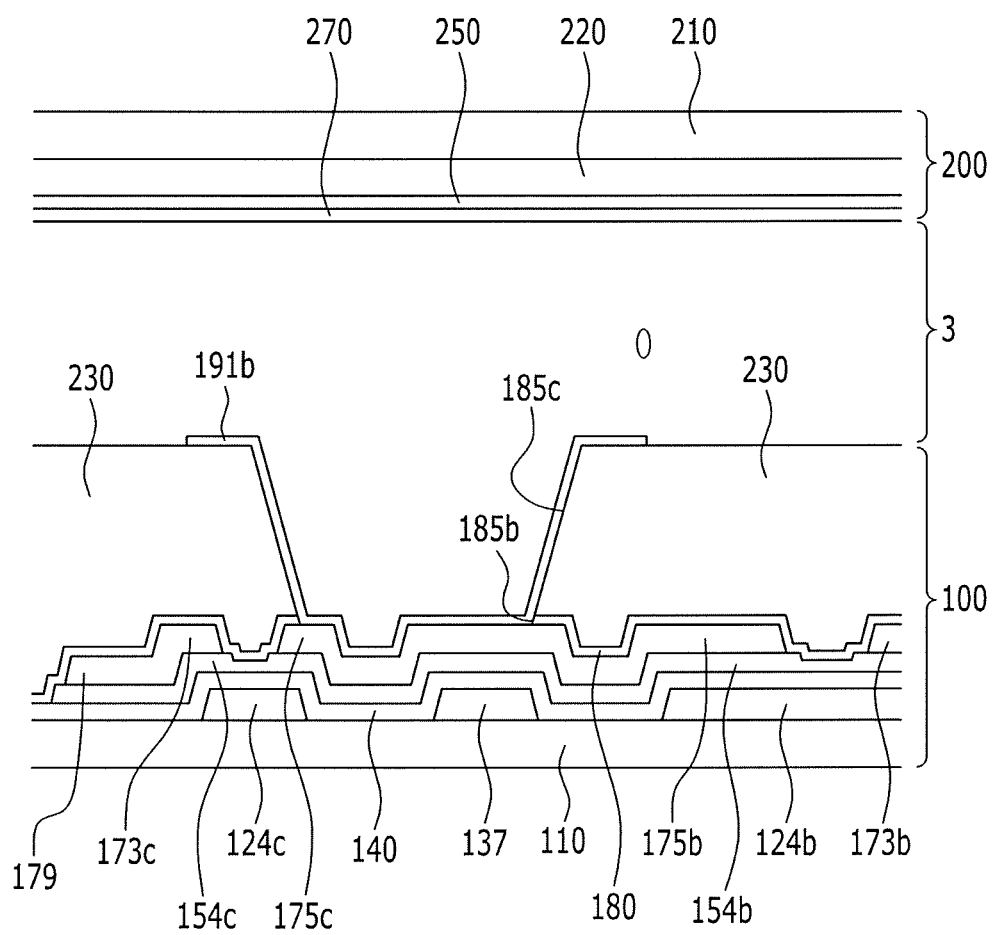
FIG. 7 is a cross-sectional view of the LCD according to an exemplary embodiment of the present invention, taken along a line VII-VII of FIG. 4.
Figure 8:
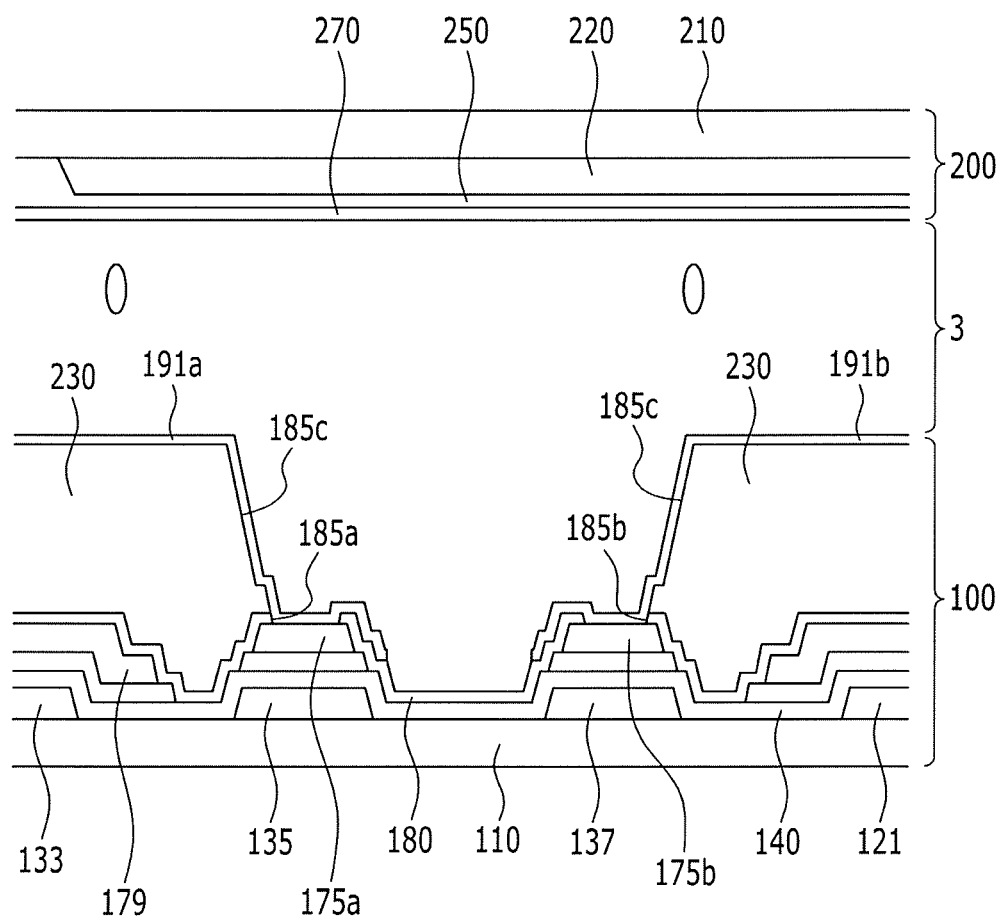
FIG. 8 is a cross-sectional view of the LCD according to an exemplary embodiment of the present invention, taken along a line VIII-VIII of FIG. 4.

FIG. 6 is a cross-sectional view of the LCD according to an exemplary embodiment of the present invention, taken along a line VI-VI of FIG. 4, FIG. 7 is a cross-sectional view of the LCD according to an exemplary embodiment of the present invention, taken along a line VII-VII of FIG. 4, and FIG. 8 is a cross-sectional view of the LCD according to an exemplary embodiment of the present invention, taken along a line VIII-VIII of FIG. 4.

Referring to FIGS. 1 and 3, the LCD according to an exemplary embodiment of the present invention includes a plurality of signal lines Gn, Dn, and SL and a plurality of pixels PX coupled to the plurality of signal lines Gn, Dn, and SL.

The signal lines Gn, Dn, and SL include a gate line Gn for transmitting a gate signal (e.g., a scanning signal), a data line Dn for transmitting a data voltage, and a storage electrode line SL to which a constant voltage is applied.

A first thin film transistor T1 and a second thin film transistor T2 are formed to be connected to a same gate line Gn and a same data line Dn.

In addition, a third thin film transistor T3 is further formed to be connected to the gate line Gn to which the first and second thin film transistors T1 and T2 are connected. The third thin film transistor T3 is connected to the second thin film transistor T2 and the storage electrode line SL.

Each pixel PX includes two subpixels PXa and PXb. A first liquid crystal capacitor Clca is formed in the first subpixel PXa to be connected to the first thin film transistor T1, and a second liquid crystal capacitor Clcb is formed in the second subpixel PXb to be connected to the second thin film transistor T2

A first terminal of the first thin film transistor T1 is connected to the gate line Gn, a second terminal thereof is connected to the data line Dn, and a third terminal thereof is connected to the first liquid crystal capacitor Clca.

A first terminal of the second thin film transistor T2 is connected to the gate line Gn, a second terminal thereof is connected to the data line Dn, and a third terminal thereof is connected to the second liquid crystal capacitor Clcb.

A first terminal of the third thin film transistor T3 is connected to the gate line Gn, a second terminal thereof is connected to the third terminal of the second thin film transistor T2, and a third terminal thereof is connected to the storage electrode line SL.

An operation of the LCD according to an exemplary embodiment of the present invention will now be described. When a gate-on voltage is applied to the gate line Gn, the first, second, and third thin film transistors T1, T2, and T3 connected to the gate line Gn are turned on, and the first and second liquid crystal capacitors Clca and Clcb are charged by a data voltage that is transmitted through the data line Dn.

In this case, since the third thin film transistor T3 is in a turned-on state, a voltage charged in the second liquid crystal capacitor Clcb is partially leaked through the storage electrode line SL.

Accordingly, even if the data voltages transmitted to the first and second subpixels PXa and PXb through the data line Dn are identical to each other, the voltages charged in the first and second liquid crystal capacitors Clca and Clcb may be different from each other.

For example, the voltage charged in the second liquid crystal capacitor Clcb is lower than that charged in the first liquid crystal capacitor Clca.

Thus, the voltages charged in the subpixels PXa and PXb in the same pixel PX may be varied to increase side visibility.

A structure of the LCD according to an exemplary embodiment of the present invention will be further described with reference to FIGS. 4 to 8.

At first, the thin film transistor array panel 100 will be described.

A gate metal layer including a gate line 121, a first gate electrode 124a, a second gate electrode 124b, an auxiliary electrode 125, and a third gate electrode 124c is formed on a first substrate 110 that is formed of transparent glass, plastic, or the like.

The gate line 121 extends primarily in a horizontal direction to transmit a gate signal.

The first and second gate electrodes 124a and 124b protrude from the gate line 121 and are connected to each other.

When viewed on a plane, the first and second gate electrodes 124a and 124b may upwardly protrude from the gate line 121, and the first gate electrode 124a may be disposed above the second gate electrode 124b.

The auxiliary electrode 125 and the third gate electrode 124c protrude from the gate line 121, and are connected to each other.

The auxiliary electrode 125 and the third gate electrode 124c upwardly protrude from the gate line 121 on the plane, and the auxiliary electrode 125 may be disposed above the third gate electrode 124c.

The first gate electrode 124a and the auxiliary electrode 125 are separated from each other while interposing a predetermined interval therebetween.

The second gate electrode 124b and the third gate electrode 124c are separated from each other while interposing a predetermined interval therebetween.

The first gate electrode 124a, the second gate electrode 124b, the third gate electrode 124c, and the auxiliary electrode 125 are connected to the same gate line 121 such that they are applied with substantially the same gate signal.

A storage electrode 133 may be further formed on the first substrate 110.

The storage electrode 133 may be formed to surround edges of two subpixels PXa and PXb.

In addition, the storage electrode 133 may be further vertically formed at a center of the two subpixels PXa and PXb.

Storage electrodes 133 disposed in adjacent pixels PX are connected to each other.

A constant voltage such as the common voltage or the like is applied to the storage electrode 133.

The storage electrode 133 extends to further form a first electrode 135 and a second electrode 137.

The first electrode 135 is disposed between the first gate electrode 124a and the auxiliary electrode 125, and the second electrode 137 is disposed between the second gate electrode 124b and the third gate electrode 124c.

The first and second electrodes 135 and 137 are connected to the storage electrode 133 to be applied with the constant voltage.

A gate insulating layer 140 is formed on the gate line 121, the first gate electrode 124a, the second gate electrode 124b, the third gate electrode 124c, the storage electrode 133, the first electrode 135, and the second electrode 137.

The gate insulating layer 140 may be formed of an inorganic insulating material such as a silicon nitride ($SiN_x$), a silicon oxide ($SiO_x$), etc.

In addition, the gate insulating layer 140 may be formed as a single layer or a multilayer.

A first semiconductor 154a, a second semiconductor 154b, and a third semiconductor 154c are formed on the gate insulating layer 140.

The first semiconductor 154a may be disposed on the first gate electrode 124a, the second semiconductor 154b may be disposed on the second gate electrode 124b, and the third semiconductor 154c may be disposed on the third gate electrode 124c.

The first semiconductor 154a, the second semiconductor 154b, and the third semiconductor 154c may be formed of amorphous silicon, polycrystalline silicon, a metal oxide, etc.

Ohmic contacts may be further disposed on the first semiconductor 154a, the second semiconductor 154b, and the third semiconductor 154c.

The ohmic contacts may be formed of a silicide or a material such as n+ hydrogenated amorphous silicon, or the like, in which an n-type impurity is doped at a high concentration.

A data metal layer including a storage electrode line 179, a data line 171, a first source electrode 173a, a first drain electrode 175a, a second source electrode 173b, a second drain electrode 175b, a third source electrode 173c, and a third drain electrode 175c is formed on the first, second, and third semiconductors 154a, 154b, and 154c and the gate insulating layer 140.

As illustrated in FIG. 4, the first, second, and third semiconductors 154a, 154b, and 154c may be further formed below the data line 171.

In addition, the first and second first semiconductors 154a and 154b may be connected to each other, and the second and third semiconductors 154b and 154c may be connected to each other. However, the present invention is not limited thereto, and the first, second, and third semiconductors 154a, 154b, and 154c may be formed only on the first, second, and third gate electrodes 124a, 124b, and 124c, or the first, second, and third semiconductors 154a, 154b, and 154c may be separated from each other.

The storage electrode line 179 transmits the constant voltage, and extends primarily in the vertical direction to cross the gate line 121.

The storage electrode line 179 may be vertically formed at the center of the respective subpixels PXa and PXb.

The storage electrode line 179 may overlap the storage electrode 133.

The storage electrode line 179 is formed to bypass an area between the two subpixels PXa and PXb via edges of the area.

The storage electrode line 179 does not overlap the first gate electrode 124a, the second gate electrode 124b, the auxiliary electrode 125, the first electrode 135, or the second electrode 137.

The storage electrode line 179 may be applied with substantially the same voltage as or a different voltage from that applied to the storage electrode 133.

For example, the voltage applied to the storage electrode line 179 may differ from that applied to the storage electrode 133 by about 3 V.

The data line 171 transmits the data signal, and extends primarily in the vertical direction to cross the gate line 121.

The data line 171 is formed on the same layer as the storage electrode line 179 and extends to be substantially parallel with the storage electrode line 179.

The first source electrode 173a is formed to protrude above the first gate electrode 124a from the data line 171.

The first source electrode 173a may be bent in a "C"-shape on the first gate electrode 124a.

The first drain electrode 175a is formed on the first gate electrode 124a to be separated from the first source electrode 173a.

A channel is formed in an exposed portion of the first semiconductor 154a between the first source electrode 173a and the first drain electrode 175a that are formed to be separated from each other.

The first drain electrode 175a includes a first bar portion 176a overlapping the first gate electrode 124a, a first expansion 177a extending from the first bar portion 176a, and a second bar portion 178a extending from the first expansion 177a.

The first bar portion 176a is surrounded by the first source electrode 173a.

The first expansion 177a is formed wider than the first bar-shaped portion 176a, and is disposed between the first gate electrode 124a and the auxiliary electrode 125.

The first expansion 177a may overlap the first electrode 135.

The second bar portion 178a overlaps the auxiliary electrode 125.

The first bar portion 176a, the first expansion 177a, and the second bar portion 178a of the first drain electrode 175a may be disposed on a straight line substantially parallel with the gate line 121.

The second source electrode 173b is formed to protrude above the second gate electrode 124b from the data line 171.

The second source electrode 173b may be bent in a "C"-shape on the second gate electrode 124b.

The second drain electrode 175b is formed on the second gate electrode 124b to be separated from the second source electrode 173b.

A channel is formed in an exposed portion of the second semiconductor 154b between the second source electrode 173b and the second drain electrode 175b that are formed to be separated from each other.

The second drain electrode 175b includes a third bar portion 176b overlapping the second gate electrode 124b, and a second expansion 177b extending from the third bar portion 176b.

The third bar portion 176b is surrounded by the second source electrode 173b.

The second expansion 177b is formed wider than the third bar-shaped portion 176b, and is disposed between the second gate electrode 124b and the third gate electrode 124c.

The second expansion 177b may overlap the second electrode 137.

The third source electrode 173c is connected to the second drain electrode 175b (e.g., the second expansion 177b of the second drain electrode 175b), and the third source electrode 173c is disposed on the third gate electrode 124c.

The third source electrode 173c has a bar shape.

A portion of the third source electrode 173c overlapping a center portion of the third gate electrode 124c may be formed wider than the other portions of the third source electrode 173c.

The third bar portion 176b, the second expansion 177b, and the third source electrode 173c of the second drain electrode 175b may be disposed on a straight line substantially parallel with the gate line 121.

The third drain electrode 175c is formed on the third gate electrode 124c to be separated from the third source electrode 173c.

A channel is formed in an exposed portion of the third semiconductor 154 between the third source electrode 173c and the third drain electrode 175c that are formed to be separated from each other.

The first gate electrode 124a, the first semiconductor 154a, the first source electrode 173a, and the first drain electrode 175a that are described above form the first thin film transistor.

In addition, the second gate electrode 124b, the second semiconductor 154b, the second source electrode 173b, and the second drain electrode 175b form the second thin film transistor.

The third gate electrode 124c, the third semiconductor 154c, the third source electrode 173c, and the third drain electrode 175c form the third thin film transistor.

As described above, the first to third thin film transistors are disposed on each of the red, blue, green, and white pixels. In this case, first to third thin film transistors disposed in each of the red and green pixels are designed to have different channel widths and/or channel lengths than first to third thin film transistors disposed in each of the white and blue pixels, and thus, driving voltages of the red and green pixels are higher than those of the white and blue pixels.

For example, when a channel width of a third thin film transistor disposed in each of the red and green pixels is formed smaller than that of a third thin film transistor disposed in each of the white and blue pixels, an amount of charges discharged via the third thin film transistor in the red and green pixels is smaller than that in the white and blue pixels and thus, voltages charged in second subpixels PXb of the red and green pixels is higher than those charged in second subpixels PXb of the white and blue pixels. The channel width of the first thin film transistor or the second thin film transistor may be varied such that the charged voltages of the red and green pixels are higher than those of the white and blue pixels.

In an exemplary embodiment of the present invention, at least one of the channel lengths of the first to third thin film transistors may be varied such that the charged voltages of the red and green pixels are higher than those of the white and blue pixels.

A first passivation layer 180 is formed on the data line 171, the first, second, and third source electrodes 173a, 173b, and 173c, and the first, second, and third drain electrodes 175a, 175b, and 175c.

The first passivation layer 180 may be formed of an inorganic insulating material.

A first contact hole 185a and a second contact hole 185b are formed in the first passivation layer 180 to at least partially expose the first drain electrode 175a and the second drain electrode 175b, respectively.

The first contact hole 185a may expose the first expansion 177a of the first drain electrode 175a, and may be disposed between the first gate electrode 124a and the auxiliary electrode 125.

In addition, the first contact hole 185a may overlap the first electrode 135.

The second contact hole 185b may expose the second expansion 177b of the second drain electrode 175b, and may be disposed between the second gate electrode 124b and the third gate electrode 124c.

In addition, the second contact hole 185b may overlap the second electrode 137.

The first and second contact holes 185a and 185b are adjacent to each other.

The first and second contact holes 185a and 185b are arranged in a vertical direction and are substantially parallel to each other on the plane.

A second passivation layer 230 is formed on the first passivation layer 180.

The second passivation layer 230 may be formed of an organic insulating material, and for example, the second passivation layer 230 may be formed of a color filter.

The color filter may provide one of three primary colors such as red, green, and blue.

In addition, the color filter may include a filter for displaying a white color as well as the primary colors.

A white color filter (e.g., a filter for displaying a white color) may include a transparent organic material.

An opening 185c is formed in the second passivation layer 230, and the opening 185c overlaps the first and second contact holes 185a and 185b.

The opening 185c is not separately formed to overlap the first contact hole 185a and the second contact hole 185b, and the opening 185c is integrally formed.

Accordingly, the opening 185c exposes the first passivation layer 180 that is disposed between the first contact hole 185a and the second contact hole 185b.

An edge of the opening 185c surrounds edges of the first contact hole 185a and the second contact hole 185b.

A first subpixel electrode 191a and a second subpixel electrode 191b are formed on the second passivation layer 230.

The first subpixel electrode 191a is connected to the first drain electrode 175a through the first contact hole 185a and the opening 185c. The second subpixel electrode 191b is connected to the second drain electrode 175b through the second contact hole 185b and the opening 185c.

For example, the first subpixel electrode 191a may be connected to the first expansion 177a of the first drain electrode 175a, and the second subpixel electrode 191b may be connected to the second expansion 177b of the second drain electrode 175b.

Through the opening 185c, the first subpixel electrode 191a and the first drain electrode 175a are connected to each other, and the second subpixel electrode 191b and the second drain electrode 175b are connected to each other.

The first and second subpixel electrodes 191a and 191b are applied with the data voltages from the first and second drain electrodes 175a and 175b, respectively.

In this case, the data voltage applied to the second drain electrode 175b is divided by the third source electrode 173c, and thus, the voltage applied to the second subpixel electrode 191b is smaller than that applied to the first subpixel electrode 191a.

This corresponds to a case where the data voltages applied to the first and second subpixel electrodes 191a and 191b have positive polarities. In addition, when the data voltages applied to the first and second subpixel electrodes 191a and 191b have negative polarities, the voltage applied to the first subpixel electrode 191a is smaller than that applied to the second subpixel electrode 191b.

A size of the second subpixel electrode 191b may be one to two times the size of the first subpixel electrode 191a.

As shown in FIGS. 4 and 5, the first subpixel electrode 191a includes a first cross-shaped stem portion which has an overall quadrangular shape and includes a horizontal stem portion 192a and a vertical stem portion 193a perpendicular to the horizontal stem portion 192a. In addition, the second subpixel electrode 191b includes a second cross-shaped stem portion which has an overall quadrangular shape and includes a horizontal stem portion 192b and a vertical stem portion 193b perpendicular to the horizontal stem portion 192b. The first and second cross-shaped stem portions are adjacent to each other in a column direction.

In addition, the first subpixel electrode 191a is divided into four subregions by the horizontal stem portion 192a and the vertical stem portion 193a, and the second subpixel electrode 191b is divided into four subregions by the horizontal stem portion 192b and the vertical stem portion 193b. Each subregion of the first subpixel electrode 191a includes a plurality of minute branch portions 194a, and each subregion of the second subpixel electrode 191b includes a plurality of minute branch portions 194b. In the first subpixel electrode 191a, a first subregion of the four subregions may include minute branch portions 194a obliquely extending in an upper left direction from the horizontal stem portion 192a or the vertical stem portion 193a, a second subregion of the four subregions may include minute branch portions 194a obliquely extending in an upper right direction from the horizontal stem portion 192a or the vertical stem portion 193a, a third subregion of the four subregions may include minute branch portions 194a obliquely extending in a lower left direction from the horizontal stem portion 192a or the vertical stem portion 193a, and a fourth subregion of the four subregions may include minute branch portions 194a obliquely extending in a lower right direction from the horizontal stem portion 192a or the vertical stem portion 193a.

In addition, the second subpixel electrode 191b, a first subregion of the four subregions may include minute branch portions 194b obliquely extending in an upper left direction from the horizontal stem portion 192b or the vertical stem portion 193b. A second subregion of the four subregions may include minute branch portions 194b obliquely extending in an upper right direction from the horizontal stem portion 192b or the vertical stem portion 193b. A third subregion of the four subregions may include minute branch portions 194b obliquely extending in a lower left direction from the horizontal stem portion 192b or the vertical stem portion 193b. A fourth subregion of the four subregions may include minute branch portions 194b obliquely extending in a lower right direction from the horizontal stem portion 192b or the vertical stem portion 193b.

Each of the minute branch portions 194a and 194b forms an angle of approximately 40° to 45° with respect to the gate line 121 or the horizontal stem portions 192a and 192b.

In addition, the minute branch portions 194a and 194b of the two adjacent subregions may be substantially perpendicular to each other.

A shielding electrode 197 may be further formed on the second passivation layer 230.

The shielding electrode 197 may be formed on the same layer as the first and second subpixel electrodes 191a and 191b.

The shielding electrode 197 may overlap the data line 171.

The shielding electrode 197 may be formed to have a smaller width than the data line 171.

The shielding electrode 197 may be applied with the constant voltage.

Hereinafter, the display panel 200 opposite to the thin film transistor array panel 100 will be described.

Referring to FIGS. 6 to 8, a light blocking member 220 is formed on a second substrate 210 that is formed of transparent glass, plastic, or the like.

The light blocking member 220 may be referred to as a black matrix, and may serve to prevent leakage of light.

The light blocking member 220 may overlap the gate line 121, the data line 171, the first, second, and third thin film transistors, the first contact hole 185a, the second contact hole 185b, and the opening 185c.

A plurality of color filters may be formed on the second substrate 210.

In an exemplary embodiment of the present invention, the second passivation layer 230 may be formed as a color filter, for example, the color filter might not be formed on the second substrate 210.

An overcoat 250 may be formed on the light blocking member 220, and a common electrode 270 is formed on the overcoat 250.

Although the light blocking member 220 and the common electrode 270 have been described to be formed on the display panel 200, the present invention is not limited thereto.

The light blocking member 220 and the common electrode 270 may be formed in the thin film transistor array panel 100.

In an exemplary embodiment of the present invention described above, the channel widths and/or the channel lengths of at least one of the first to third thin film transistors disposed in each pixel may be varied such that the driving voltages of the red and green pixels are higher than those of the white and blue pixels.

In an exemplary embodiment of the present invention, the voltages of the storage electrode line SL may be varied such that the driving voltages of the red and green pixels are higher than those of the white and blue pixels.

For example, when the voltage of the storage electrode line SL connected to the white and blue pixels is lower than that of the storage electrode line SL connected to the red and green pixels, an amount of charges flowing into or out of the white and blue pixels through the storage electrode line SL may be larger than that of the red and green pixels, and thus, the driving voltages of the white and blue pixels may be lower than those of the red and green pixels. Thus, as described above, when the driving voltages of the white and blue pixels are lower than those of the red and green pixels, the side yellowish phenomenon may be reduced. In this case, luminance at the front of the LCD may be decreased as the driving voltages of the white and blue pixels decrease.

Accordingly, in an exemplary embodiment of the present invention, sizes of the white and blue pixels may be formed larger than those of the red and green pixels.

Figure 9:
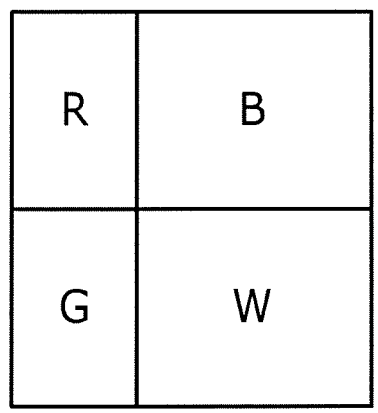
FIGS. 9 and 10 are layout views of red, green, blue, and white pixels of the LCD according to an exemplary embodiment of the present invention, respectively.
Figure 10:
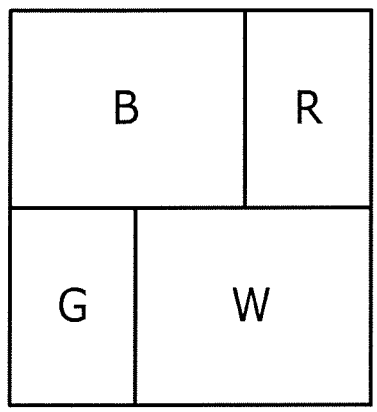

FIGS. 9 and 10 are layout views of red, green, blue, and white pixels of the LCD according to an exemplary embodiment of the present invention, respectively.

Referring to FIGS. 9 and 10, the sizes of the white and blue pixels are formed larger than those of the red and green pixels, and the white and blue pixels or the red and green pixels may be vertically arranged along a line, as shown in FIG. 9 or may be diagonally arranged, as shown in FIG. 10.

A circuit configuration of each of the white and blue pixels may be different from that of each of the red and green pixels such that the driving voltages of the white and blue pixels are lower than those of the red and green pixels.

For example, each of the white and blue pixels may have a circuit configuration of FIG. 3 described above, and each of the red and green pixels may have a circuit configuration of FIG. 11 to be described later.

Figure 11:
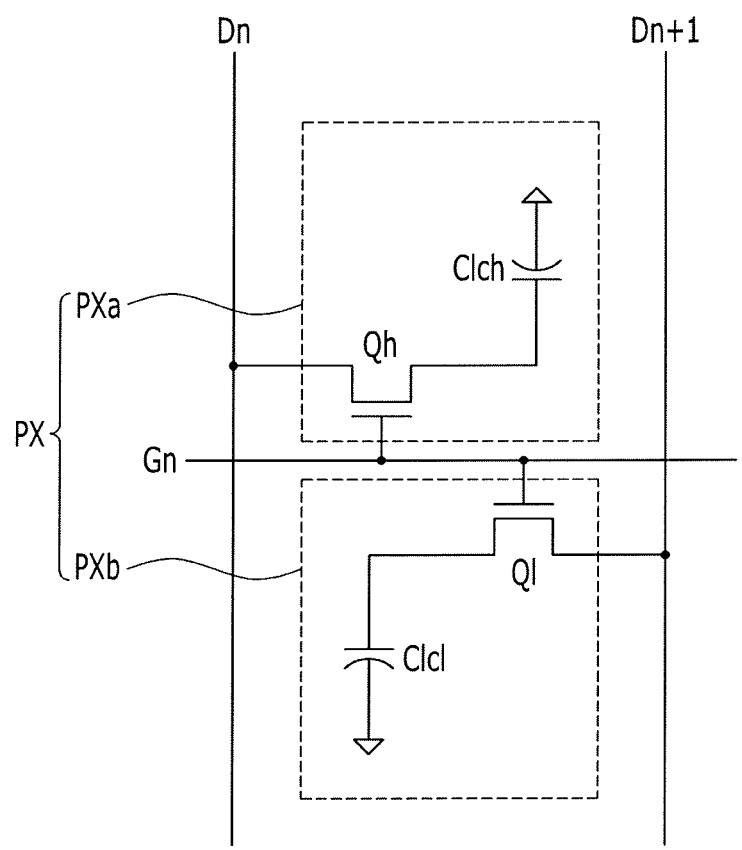
FIG. 11 is a circuit diagram of each of a red pixel and a green pixel of an LCD according to an exemplary embodiment of the present invention.

FIG. 11 is a circuit diagram of each of a red pixel and a green pixel of an LCD according to an exemplary embodiment of the present invention.

Referring to FIG. 11, control terminals of first and second thin film transistors Qh and Ql are formed to be connected to the same gate line Gn.

An input terminal of the first thin film transistor Qh is connected to a data line Dn to the left of a pixel PX (e.g., the red pixel or the green pixel), and an input terminal of the second thin film transistor Ql is connected to a data line D(n+1) to the right of the pixel.

Each pixel PX includes first and second subpixels PXa and PXb, and a first liquid crystal capacitor Clch is formed in the first subpixel PXa to be connected to an output terminal of the first thin film transistor Qh, and a second liquid crystal capacitor Clcl is formed in the second subpixel PXb to be connected to an output terminal of the second thin film transistor Ql.

In the red and green pixels each having the aforementioned structure, since the first and second subpixels PXa and PXb respectively receive image signal voltages from the different data lines Dn and D(n+1), voltages applied to the first and second subpixels PXa and PXb may be freely set.

Accordingly, at substantially the same gray level, the red and green pixels may be controlled to have a higher voltage than the white and blue pixels.

In addition, there are several configuration schemes for reducing the yellowish phenomenon.

Figure 12:
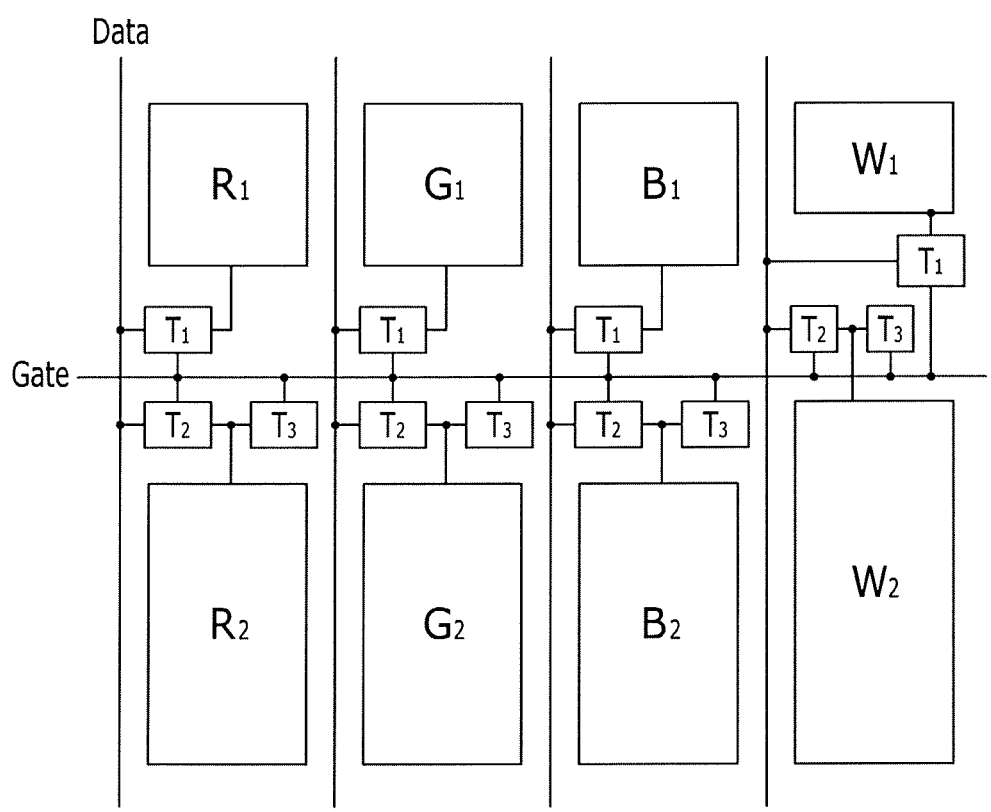
FIG. 12 is a layout view of pixels of an LCD according to an exemplary embodiment of the present invention.
Figure 13:
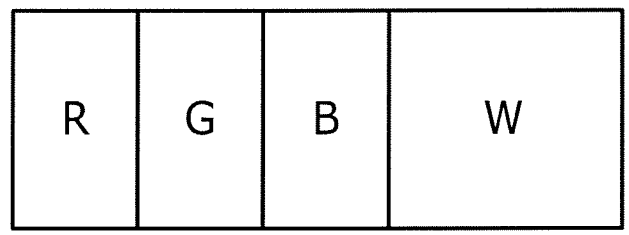
FIG. 13 is a layout view of pixels of an LCD according to an exemplary embodiment of the present invention.
Figure 14:
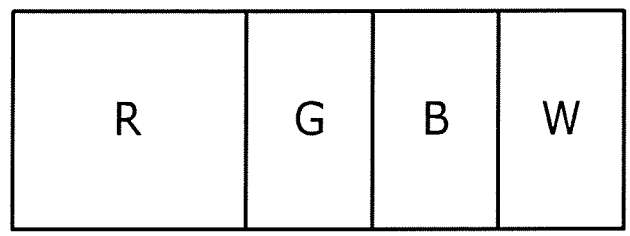
FIG. 14 is a layout view of pixels of a liquid crystal display according to an exemplary embodiment of the present invention.
Figure 15:
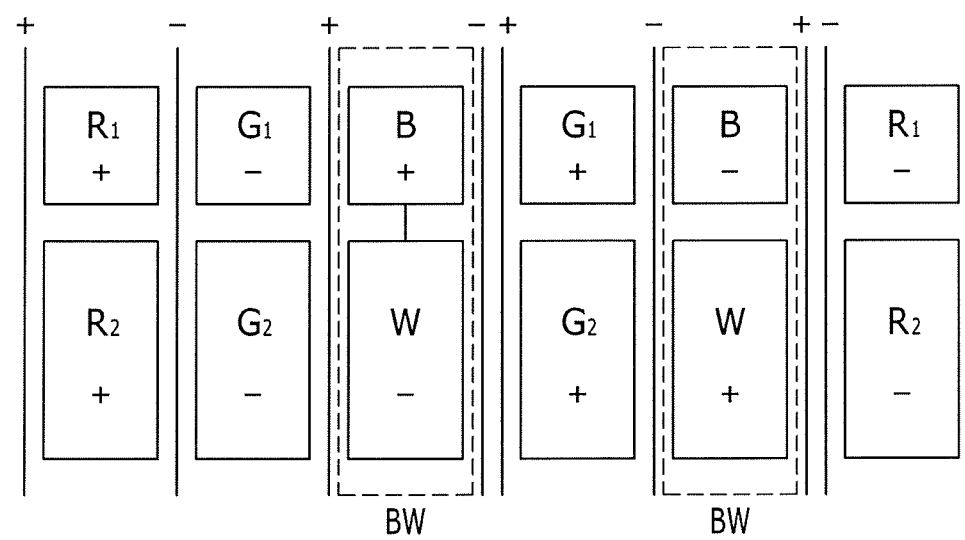
FIG. 15 is a layout view of pixels of an LCD according to an exemplary embodiment of the present invention.
Figure 16:
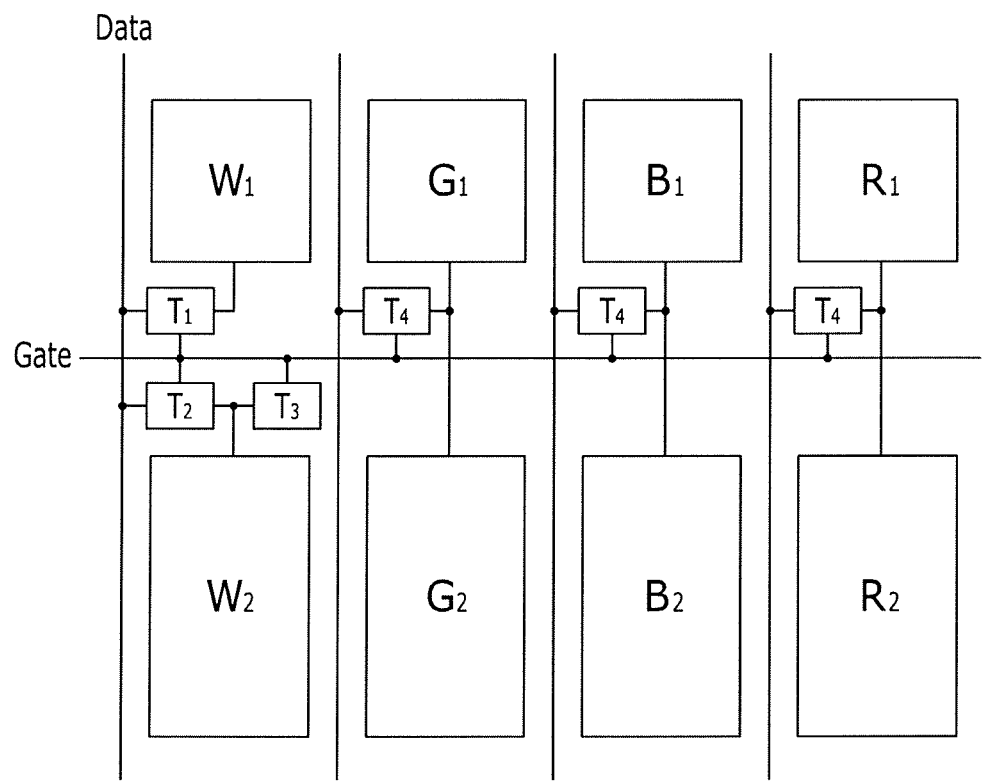
FIG. 16 is a layout view of pixels of an LCD according to an exemplary embodiment of the present invention.

FIG. 12 is a layout view of pixels of an LCD according to an exemplary embodiment of the present invention, FIG. 13 is a layout view of pixels of an LCD according to an exemplary embodiment of the present invention, FIG. 14 is a layout view of pixels of an LCD according to an exemplary embodiment of the present invention, FIG. 15 is a layout view of pixels of an LCD according to an exemplary embodiment of the present invention, and FIG. 16 is a layout view of pixels of an LCD according to an exemplary embodiment of the present invention.

Referring to FIG. 12, first subpixel electrodes R1, G1, and B1, which are included in red, green, and blue pixels, respectively, are disposed above a gate line Gate. Second subpixel electrodes R2, G2, and B2, which are included in red, green, and blue pixels, respectively, are disposed below the gate line Gate. Three thin film transistors T1, T2, and T3 of each of the red, green, and blue pixels are distributed above and below the gate line Gate.

First and second subpixel electrodes W1 and W2 of a white pixel are disposed above or below the gate line Gate and three thin film transistors T1, T2, and T3 of the white pixel are all disposed above the gate line Gate, unlike as shown in the red, green, and blue pixels.

As such, since the three thin film transistors T1, T2, and T3 may all be disposed above the gate line Gate in the white pixel, a size of the first subpixel electrode W1 of the white pixel may be decreased and a size of the second subpixel electrode W2 of the white pixel may be increased.

In this case, since the second subpixel electrode W2 is applied with a lower voltage than the first subpixel electrode W1, an effect of substantially reducing a driving voltage of the entire white pixel occurs.

In an exemplary embodiment of the present invention, to reduce the yellowish phenomenon, a slit structure of the first and second subpixel electrodes disposed in the white pixel may be changed differently from those of the other pixels (e.g., the red, blue, and green pixels).

Referring to FIG. 5, at least one of widths S of the horizontal stem portions 192a and 192b and the vertical stem portions 193a and 193b of the two subpixel electrode 191a and 191b, widths B of the minute branch portions 194a and 194b, a gap g between the minute branch portions 194a and 194b, and an angle θ between the vertical stem portions 193a and 193b and the minute branch portions 194a and 194b may be differently set in the white pixel than in the other pixels (e.g., the red, blue, and green pixels).

Reduction in the yellowish phenomenon of the white pixel at the sides may be achieved by changing the slit structure of the first and second subpixel electrodes in the white pixel.

In a method of reducing the yellowish phenomenon according to an exemplary embodiment of the present invention, the white pixel may have a different cell gap and cell size from the other pixels (e.g., the red, blue, and green pixels).

Referring to FIG. 13, the size of the white pixel W is larger than or equal to those of the other pixels (e.g., the red, blue, and green pixels), the cell gap of the white pixel W is set to substantially 50% to 90% of those of the other pixels, and thus, retardation of the white pixel due to a liquid crystal layer may be reduced compared with those of the other pixels.

In this case, referring to FIG. 6, the cell gap may be referred to as a thickness Cg of the liquid crystal layer.

For example, referring to FIG. 14, the retardation of the white pixel due to the liquid crystal layer may be increased compared with those of the other pixels (e.g., the red, blue, and green pixels) by setting the size of the white pixel to be smaller than those of the other pixels and the cell gap to be substantially 105% to 150% of those of the other pixels.

In a method of reducing the yellowish phenomenon according to an exemplary embodiment of the present invention, a blue pigment (e.g., a blue dye) may be added to a color filter of the white pixel to enable the white pixel to emit bluish-white light.

In a method of reducing the yellowish phenomenon according to an exemplary embodiment of the present invention, the respective blue pixel and the white pixel may be formed to have substantially the same sizes as two subpixels of each of the other pixels.

Referring to FIG. 15, the red and green pixels respectively include two subpixel electrodes R1 and R2 and two subpixel electrodes G1 and G2. For example, the subpixel electrodes R1 and G1 may be applied with one of relatively high and low voltages, and the subpixel electrodes R2 and G2 may be applied with another one of the relatively high and low voltages. In addition, a pixel electrode of the blue pixel is disposed to have a size corresponding to one of the subpixel electrodes R1 and G1 of the red and green pixels, and a pixel electrode of the white pixel is disposed to have a size corresponding to one of the subpixel electrodes R2 and G2 of the red and green pixels.

When a column inversion driving is performed, an arrangement of the blue pixel and the white pixel with the red and green pixels may be changed to prevent pixels of the same color and polarity from being disposed adjacent to each other. For example, the pixels may be arranged in an order of red, green, blue (white), green, blue (white), red, blue (white), red, green, etc, where the "blue (white)" may be understood as two colors of two pixels disposed in areas BW, as shown in FIG. 15.

Referring to FIG. 16, in a white pixel, first and second subpixel electrodes W1 and W2 thereof are disposed above and below a gate line Gate, and three thin film transistors T1, T2, and T3 are disposed above and below the gate line Gate.

In red, green, and blue pixels, first subpixel electrodes R1, G1, and B1 and second subpixel electrodes R2, G2, and B2 are disposed above and below the gate line Gate in substantially the same manner to that in the white pixel, but two subpixel electrodes (e.g., R1/R2, G1/G2, or B1/B2) of each of the red, green, blue pixels are connected to a same thin film transistor T4.

In this case, in the red, green, and blue pixels, the first subpixel electrodes R1, G1, and B1 may be connected to a corresponding one of the second subpixels R2, G2, and B2 such that they are integrally formed.

In the red, green, and blue pixels having the aforementioned structure, substantially the same voltage may be applied to the first subpixel electrodes R1, G1, and B1 and the second subpixel electrodes R2, G2, and B2 (for example, substantially the same voltage may be applied to the two subpixel electrodes (e.g., R1/R2, G1/G2, or B1/B2) of each of the red, green, blue pixels). In the white pixel, an overall voltage applied to the white pixel may be lower than those applied to the other pixels since the second subpixel electrode W2 of the white pixel is applied with a lower voltage than the first subpixel electrode W1 of the white pixel. For example, a size of the second subpixel electrode W2 may be larger than that of the first subpixel electrode W1.

While the present invention has been particularly described with reference to exemplary embodiments thereof, it will be understood that the present invention is not limited to the disclosed embodiments thereof.

What is claimed is:

1. A display device comprising:
a red pixel, a blue pixel, a green pixel, and a white pixel;
a plurality of gate lines;
a plurality of data lines; and
a plurality of storage electrode lines,
wherein each of the red, blue, green, and white pixels comprises:
first and second thin film transistors each including control terminals connected to a first gate line of the plurality of gate lines and input terminals connected to a first data line of the plurality of data lines;
a third thin film transistor including a control terminal connected to the first gate line, an input terminal connected to an output terminal of the second thin film transistor, and an output terminal connected to a first storage electrode line of the plurality of storage electrode lines;
a first subpixel electrode connected to an output terminal of the first thin film transistor; and
a second subpixel electrode connected to the output terminal of the second thin film transistor,
wherein a channel width of the third thin film transistor included in each of the red and green pixels is larger than a channel width of the third thin film transistor included in each of the blue and white pixels, or
wherein a channel length of the third thin film transistor included in each of the red and green pixels is longer than a channel length of the third thin film transistor included in each of the blue and white pixels.

2. The display device of claim 1, wherein sizes of the blue and white pixels are larger than a size of each of the red and green pixels.

3. A display device comprising:
a red pixel, a blue pixel, a green pixel, and a white pixel;
a plurality of gate lines;
a plurality of data lines; and
a plurality of storage electrode lines,
wherein each of the red, blue, green, and white pixels comprises:
first and second thin film transistors, each including control terminals connected to a first gate line of the plurality of gate lines and input terminals connected to a first data line of the plurality of data lines;
a third thin film transistor including a control terminal connected to the first gate line, an input terminal connected to an output terminal of the second thin film transistor, and an output terminal connected to a first storage electrode line of the plurality of storage electrode lines;
a first subpixel electrode connected to an output terminal of the first thin film transistor; and
a second subpixel electrode connected to the output terminal of the second thin film transistor,
wherein voltages applied to the first storage electrode lines connected to the blue and white pixels are higher than voltages applied to the first storage electrode lines connected to the red and green pixels.

4. The display device of claim 3, wherein sizes of the blue and white pixels are larger than a size of each of the red and green pixels.

5. A display device comprising:
a red pixel, a blue pixel, a green pixel, and a white pixel;
a plurality of gate lines;
a plurality of data lines; and
a plurality of storage electrode lines, wherein each of the red pixel and the green pixel comprises:
first and second thin film transistors each including control terminals connected to a first gate line of the plurality of gate lines and input terminals connected to a first data line of the plurality of data lines;
a third thin film transistor including a control terminal connected to the first gate line, an input terminal connected to an output terminal of the second thin film transistor, and an output terminal connected to a first storage electrode line of the plurality of storage electrode lines;
a first subpixel electrode connected to an output terminal of the first thin film transistor; and
a second subpixel electrode connected to the output terminal of the second thin film transistor,
wherein each of the blue pixel and the white pixel comprises:
a fourth thin film transistor including a control terminal connected to a second gate line of the plurality of gate lines and an input terminal connected to a second data line of the plurality of data lines;
a fifth thin film transistor including a control terminal connected to the second gate line and an input terminal connected to a third data line of the plurality of data lines;
a third subpixel electrode connected to an output terminal of the fourth thin film transistor; and
a fourth subpixel electrode connected to an output terminal of the fifth thin film transistor.

6. The display device of claim 5, wherein sizes of the blue and white pixels are larger than a size of each of the red and green pixels.

7. The display device of claim 5, wherein each of the first subpixel electrode, the second subpixel electrode, the third subpixel electrode, and the fourth subpixel electrode comprises a stern portion and minute branch portions extending from the stem portion, and
wherein the first subpixel electrode of the red pixel or the green pixel is different from the third subpixel electrode of the white pixel in at least one of a width of the stem portion, a tilt angle of the stem portion, a width of the minute branch portions, an interval between the minute branch portions, and a tilt angle of the minute branch portions.

8. A display device comprising:
a red pixel, a blue pixel, a green pixel, and a white pixel;
a plurality of gate lines;
a plurality of data lines; and
a plurality of storage electrode lines,
wherein each of the red, blue, green, and white pixels comprises:
first and second thin film transistors each including control terminals connected to a first gate line of the plurality of gate lines and input terminals connected to a first data line of the plurality of data lines;
a third thin film transistor including a control terminal connected to the first gate line, an input terminal connected to an output terminal of the second thin film transistor, and an output terminal connected to a first storage electrode line of the plurality of storage electrode lines;
a first subpixel electrode connected to an output terminal of the first thin film transistor; and
a second subpixel electrode connected to the output terminal of the second thin film transistor,
wherein a size of the first subpixel electrode included in the white pixel is smaller than a size of each of the first subpixel electrodes included in the red, green, and blue pixels.

9. The display device of claim 8, wherein a size of the second subpixel electrode included in the white pixel is larger than a size of each of the second subpixel electrodes included in the red, green, and blue pixels.

10. The display device of claim 8, wherein the first to third thin film transistors of the white pixel are disposed above the first gate line.

11. A display device comprising:
a red pixel, a blue pixel, a green pixel, and a white pixel, the red pixel, the blue pixel, and the white pixel including a liquid crystal layer disposed between a first substrate and a second substrate facing each other;
a plurality of gate lines; and
a plurality of data lines,
wherein a size of the white pixel is larger than a size of each of the red, blue, and green pixels, and a thickness of the liquid crystal layer of the white pixel is smaller than a thickness of the liquid crystal layer of each of the red, blue, and green pixels.

12. The display device of claim 11, wherein the size of the white pixel is larger than the size of each of the red, blue, and green pixels, and the thickness of the liquid crystal layer of the white pixel corresponds to substantially 50% to 90% of the thickness of the liquid crystal layer of each of the red, blue, and green pixels.

13. A display device comprising:
a red pixel, a blue pixel, a green pixel, and a white pixel, wherein the white pixel includes a blue dye;
a plurality of gate lines;
a plurality of data lines;
a plurality of storage electrode lines,
wherein each of the white pixel and the blue pixel comprises:
first and second thin film transistors each including control terminals connected to a first gate line of the plurality of gate lines and input terminals connected to a first data line of the plurality of data lines;
a third thin film transistor including a control terminal connected to the first gate line, an input terminal connected to an output terminal of the second thin film transistor and an output terminal connected to a first storage electrode line of the plurality of storage electrode lines;
a first subpixel electrode connected to an output terminal of the first thin film transistor; and
a second subpixel electrode connected to the output terminal of the second thin film transistor,
wherein each of the red, pixel and the green pixel comprises;
a fourth thin film transistor including a control terminal connected to a second gate line of the plurality of gate lines and an input terminal connected to a second data line of the plurality of data lines;
a fifth thin film transistor including a control terminal connected to the second gate line and an input terminal connected to a third data line of plurality of data lines;
a third subpixel electrode connected to an output terminal of the fourth thin film transistor; and
a fourth subpixel electrode connected to an output terminal of the fifth thin film transistor.

14. A display device comprising:
first and second red pixels, a blue pixel, first and second green pixels, and a white pixel arranged in a first direction;
wherein each of the first and second red pixels includes first and second subpixel electrodes,
wherein each of the first and second green pixels includes third and fourth subpixel electrodes,
wherein the blue pixel includes a first pixel electrode, and
wherein the white pixel includes a second pixel electrode, and
wherein a size of the first pixel electrode corresponds to a size of the first subpixel electrode, and a size of the second pixel electrode corresponds to a size of the second subpixel electrode.

15. The display device of claim 14, wherein the blue pixel and the white pixel are disposed between the first red pixel and the first green pixel, or between the first and second red pixels, or between the first and second green pixels.

16. The display device of claim 14, wherein a first voltage is applied to the first subpixel electrode, and a second voltage lower than the first voltage is applied to the second subpixel electrode.

17. A display device comprising:
a red pixel a blue pixel, a green pixel, and a white pixel;
a plurality of gate lines;
a plurality of data lines; and
a plurality of storage electrode lines,
wherein the white pixel comprises first and second subpixel electrodes connected to a first gate line of the plurality of gate lines and a first data line of the plurality of data lines, and
different voltages are applied to the first and second subpixel electrodes of the white pixel, and
wherein each of the red, blue, and green pixels comprises third and fourth subpixel electrodes connected to a second data line of the plurality of data lines and the first gate line, and
substantially the same voltage is applied to the third and fourth subpixel electrodes of each of the red, blue, and green pixels.

18. The display device of claim 17, wherein the white pixel comprises;
first and second thin film transistors each including control terminals connected to the first gate line and input terminals connected to the first data line;
a third thin film transistor including a control terminal connected to the first gate line, an input terminal connected to an output terminal of the second thin film transistor, and an output terminal connected to a first storage electrode line of the plurality of storage electrode lines,
wherein the first subpixel electrode of the white pixel is connected to an output terminal of the first thin film transistor, and the second subpixel electrode of the white pixel is connected to the output terminal of the second thin film transistor.

19. The display device of claim 18, wherein each of the red, blue, and green pixels comprises a fourth thin film transistor including a control terminal connected to the first gate line and an input terminal connected to the second data line, and
wherein the third and fourth subpixel electrodes of each of the red, blue, and green pixels are connected to an output terminal of the fourth thin film transistor.

20. The display device of claim 19, wherein the third and fourth subpixel electrodes of each of the red, blue, and green pixels are connected to each other.

* * * * *